United States Patent [19]
Wolff

[11] Patent Number: 5,159,421
[45] Date of Patent: Oct. 27, 1992

[54] DOUBLE CHANNEL HETEROSTRUCTURES

[75] Inventor: Peter A. Wolff, Princeton, N.J.

[73] Assignee: NEC Research Institute, Inc., Princeton, N.J.

[21] Appl. No.: 722,709

[22] Filed: Jun. 28, 1991

[51] Int. Cl.$^5$ .............................. H01L 27/14
[52] U.S. Cl. ............................ 357/30; 357/4; 357/16; 357/22
[58] Field of Search ............ 357/4, 16, 30 E, 22 A, 357/30 P, 30 Q, 30 I, 22 MD

[56] References Cited

U.S. PATENT DOCUMENTS

| | | | |
|---|---|---|---|
| 4,743,951 | 5/1988 | Chang et al. | 357/16 X |
| 4,806,998 | 2/1989 | Vinter et al. | 357/16 X |
| 4,821,093 | 4/1989 | Iafrate et al. | 357/22 A |

FOREIGN PATENT DOCUMENTS 59-86268   5/1984   Japan .................. 357/22 MD

Primary Examiner—William Mintel
Attorney, Agent, or Firm—Arthur J. Torsiglieri

[57] ABSTRACT

A semiconductive device includes a dual channel heterostructure in which a pair of quantum wells separated by a thin barrier layer have their band gaps shifted by applied gate voltages between overlap and non-overlap relationships. When the gaps are in an overlap relationship intraband tunneling through the barrier between the two quantum wells serves to introduce charge carriers in the channels to make them conducting. A specific embodiment uses quantum wells of indium arsenide and gallium antimonide in a host lattice of aluminum antimonide.

9 Claims, 4 Drawing Sheets

DOUBLE CHANNEL HETEROSTRUCTURES

FIELD OF INVENTION

This invention relates to semiconductor devices and more particularly to such devices that utilize heterostructures involving several compound semiconductors.

BACKGROUND OF THE INVENTION

Advances in technology, particularly advances in growth techniques such as molecular beam epitaxy, have made it possible to tailor-make crystalline multilayer structures. Such structures, described as heterostructures, have made possible a host of promising electronic and optoelectronic devices. Many of the electronic devices have been aimed at providing electronic switches with faster switching speeds and to this surface have sought to utilize the increased mobility of the charge carriers, holes and electrons, attainable in multilayer structures, such as superlattices.

However, one problem that has persisted in many such devices is that the transit time for the active charge carriers to travel the relatively long distance between an input node (source) and an output node (drain) has restricted the speed with which the device can be switched between its "on", or low impedance state, and its "off", or high impedance state. A related problem that has characterized other such devices is that the switching speed has been limited by relatively long recombination times, the time it takes free electrons and holes to recombine, and so to reduce the number of charge carriers available for conduction.

An object of the present invention is a device in which these effects that limit switching speeds are reduced so that shorter switching times can be attained.

SUMMARY OF THE INVENTION

The present invention is a semiconductive device that includes a multilayer wafer that provides a pair of quantum wells that serve controllably as a pair of channels for the flow of holes and electrons separately, spaced apart by a thin high band gap barrier. Control of the charge carrier densities in the separate channels is achieved by the rapid, direct interband tunneling of electrons through the thin barrier separating the two channels.

Advantageously, the multilayer wafer comprises an opposed pair of surface layers that serve primarily as contact layers and a five layer heterostructure intermediate portion that provides the pair of quantum wells spaced apart within a host lattice of a wider band gap material. The contact layers serve primarily as the means by which the necessary operating potentials, or electric field, are established in a gate portion extending part of the distance between source and drain ends of the multilayer wafer. The contact layers may be of opposite conductivity type to establish an internal electric field in the gate portion. Advantageously, the intermediate portion between the contact layers comprises first, third and fifth layers of a wide band gap host material and second and fourth layers of different narrower band gap materials that form a misaligned type of superlattice in the wide band gap material. The two narrow band gap materials are chosen such that the top of the valence band of one can selectively be made either to, or not to, overlap significantly the bottom of the conduction band of the other so that interband tunneling through the thin barrier separating the two quantum wells can be used to control the number of charge carriers available in the dual channel and so to control the effective impedance between a pair of electrodes at source and drain ends of the dual channel. The extent of any band overlap is controlled by operating voltages applied to a pair of electrodes associated with the gate contact layers (n and p regions in a p-i-n structure).

In the preferred embodiment, the design of the device is such that each of the two channels includes at least one gate portion that is initially free of charge carriers and so non-conducting. Thereafter, a gating voltage is applied to induce interband tunneling between the two quantum wells that introduces charge carriers into such gate portions and converts them to conducting.

Removal of the gating voltage restores the original conditions and interband tunneling now eliminates essentially all the charge carriers from such gate portions of the two channels and the "off" condition or high impedance state is restored for the device.

In an illustrative embodiment of the invention, the multilayer structure comprises a host lattice of aluminum antimonide that has a p-i-n impurity profile and includes opposed p-type and n-type contact layers of aluminum antimonide and, in the intermediate intrinsic region, parallel layers of gallium antimonide and indium arsenide spaced apart by a thin barrier layer of intrinsic aluminum antimonide. These parallel layers form the dual channel and operate as a pair of quantum wells. Moreover, the thicknesses and separation of the two layers are such that the normal overlap between the conduction band of the indium arsenide and the valence band of the gallium antimonide is removed by quantum confinement effects and each of the two channels is essentially insulating rather than conducting. Advantageously, both end portions of the indium arsenide channel are made n-type conducting by concentrating donors in adjacent regions of the aluminum antimonide host, leaving an intermediate gate portion insulating, and both end portions of the gallium antimonide channel are made p-type conducting by concentrating acceptors in adjacent regions of the host aluminum antimonide, leaving an intermediate gate portion insulating. Gate electrodes are positioned on opposite sides of the two insulating gate portions of the channels. Voltages applied to these electrodes are made to shift the band gaps of the materials forming such gate portions in and out of significant overlap relationships to permit the flow back and forth across the barrier of electrons to vary the conductivity of the intermediate gated portions of the channels. With this combination of materials, the device should be operated at temperatures below room temperature, e.g. 77° Kelvin.

The combination of aluminum antimonide, gallium antimonide and indium arsenide is particularly effective because of the closeness of their lattice spacings, this making for a good lattice match that is important to the successful epitaxial growth of the multilayer wafer by processes such as molecular beam epitaxy. It is expected that the more perfect the crystalline nature of the multilayer wafer the better its device performance. However, because each of the dual channel layers may be very thin, it should be feasible to utilize a device in which the dual layers are not lattice matched, even though this will result in strained layers for the dual channels.

It is to be understood that the figures are not necessarily to scale.

DETAILED DESCRIPTION

Figure 1:
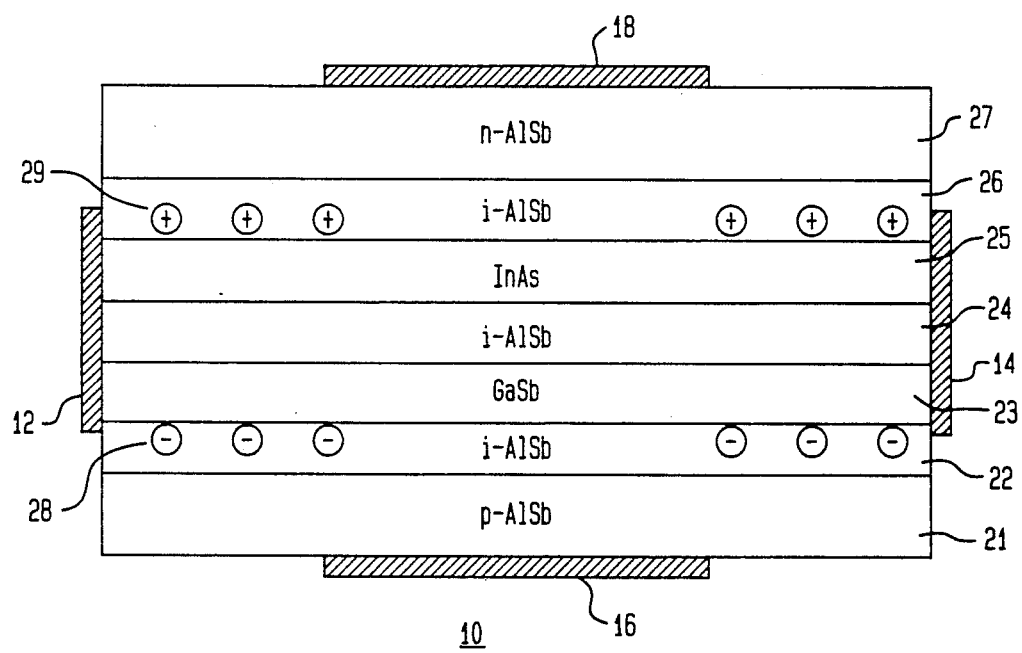
FIG. 1 shows a cross section of a dual channel heterostructure device in accordance with an illustrative embodiment of the invention.

With reference now to the drawing, FIG. 1 is a cross section of an illustrative embodiment of the invention that includes a multilayer wafer 10 with appropriate electrodes 12, 14 and 16, 18.

The multilayer layer wafer basically comprises a parallel pair of quantum wells spaced apart in a host crystal. Specifically, the wafer may be viewed as including a contact surface layer 21 of p-type AlSb, a layer 22 largely of undoped, or intrinsic, AlSb, a first gate layer 23 of GaSb that provides the first of the two quantum wells, a layer 24 of intrinsic AlSb, a layer 25 of InAs that provides the other of the two quantum wells, a layer 26 largely of undoped, or intrinsic, AlSb, and a second gate contact surface layer 27 of n-type AlSb.

Typical thicknesses or vertical dimensions for the various layers are as follows. Layer 22 would be about 200–300 angstroms, layers 23, 24 and 25 each between 40 and 60 angstroms, and layer 26 between 600 and 700 angstroms. The thicknesses of layers 21 and 27 are less important and each typically might advantageously be several thousand angstroms thick to provide mechanical strength to the wafer. Generally, the thicker the layer the larger the voltage needed to do the switching. The lateral dimensions for the wafer typically might be 3 by 3 microns.

As has been represented in FIG. 1 by the encircled minus signs ⊖, opposite end portions of layer 22 have been treated to include a thin sheet 28 of acceptor ions set back about 50 angstroms from layer 23. As has been represented by the encircled plus signs ⊕, opposite end portions of layer 26 have been treated to include a thin sheet 29 of donor ions set back 50 angstroms from layer 25. Each of sheets 28 and 29 is advantageously between 15 and 20 angstroms thick and has a surface concentration of about $3 \times 10^{12}$ ions per centimeter$^2$.

As will be discussed more fully hereinafter, sheets 28 and 29 act effectively to introduce charge carriers in the end portions of the quantum wells 23, 25, opposite such sheets, thereby to make such portions more conductive. The intermediate portions of the quantum wells 23, 25 that are to serve as the gate portions are unaffected and so remain essentially insulating in the quiescent state.

As indicated, gate electrodes 16 and 18 bridge the insulating gate portions of layers 23 and 25. Source and drain electrodes 12 and 14 may bridge layers 22, 23, 24, 25 and 26, although they can be limited to bridging only layers 23, 24 and 25, as shown.

Before discussing in detail the operation of this device, it will be helpful to review some of the basic principles applicable to the operation.

Figure 2:
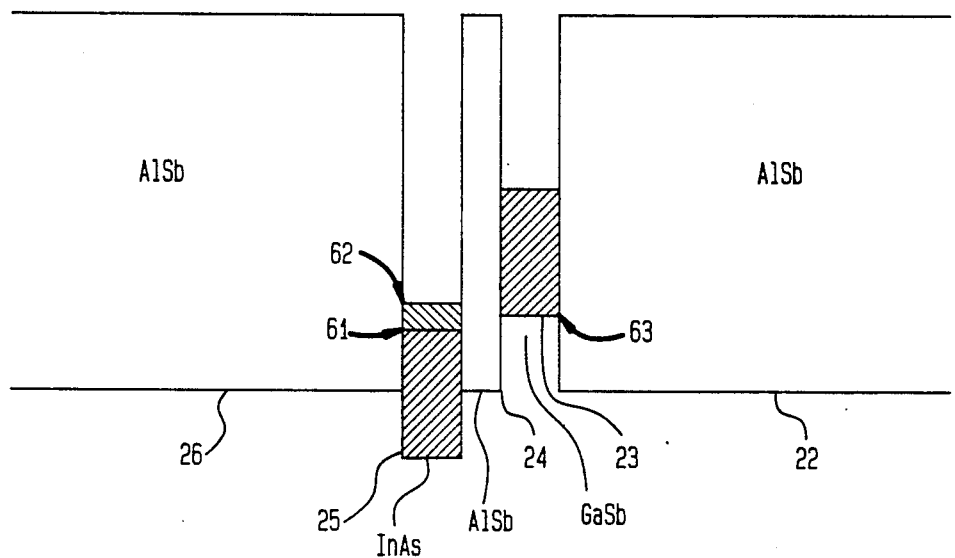
FIG. 2 is an energy band diagram of an AlSb/InAs/AlSb/GaSb/AlSb system in which quantum confinement effects occur.

FIG. 2 is the energy diagram resulting when two thin layers of materials that form a misaligned Type II superlattice, such as gallium antimonide layer 23, and indium arsenide layer 25, are imbedded in a host of a wider band gap material, such as is formed by aluminum antimonide layers 22, 24, and 26, to give rise to a pair of quantum wells. Of particular interest is the fact that if the indium arsenide layer 25 is sufficiently thin, e.g. less than 100 angstroms, quantum confinement effects will shift the normal bottom of its conduction band 61 upwards by the amount shown crosshatched to level 62. As a consequence there is removed any overlap between the bottom 62 of the conduction band and the top 63 of the valence band of the gallium antimonide, converting the superlattice formed by the two thin layers essentially into a small band gap semiconductor.

Figure 3:
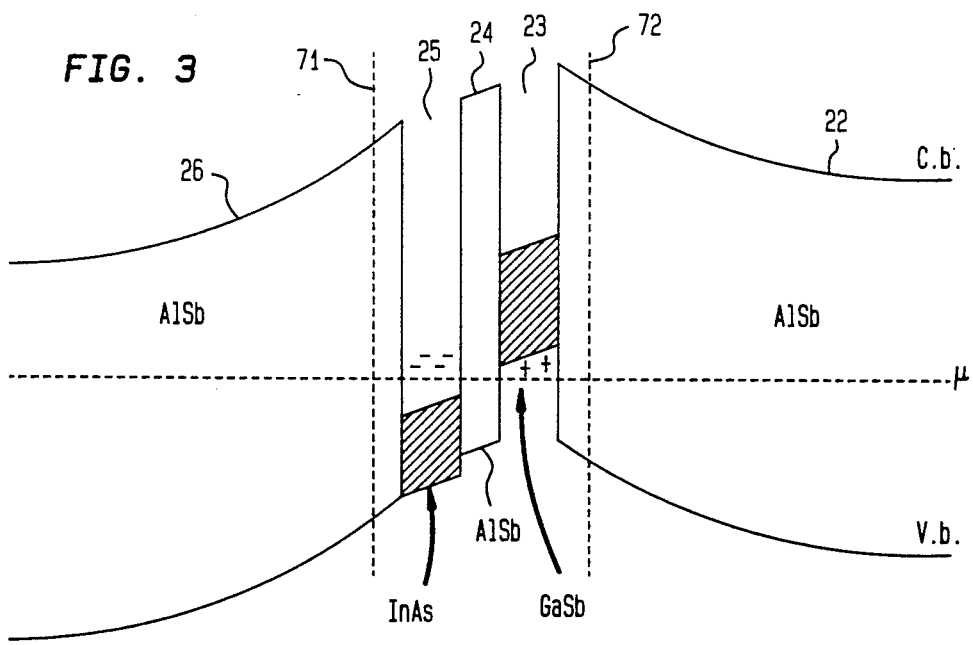
FIG. 3 is an energy diagram of the system shown in FIG. 2 in which charge carriers have been introduced into the InGa and GaSb layers by step-back doping.

However, when the wafer has been doped to include a sheet of donors adjacent to the indium arsenide channel and a sheet of acceptors adjacent to the gallium antimonide channel, as described for the end portions in the wafer shown in FIG. 1, the energy diagram shown in FIG. 3 results for the end portions of the wafer affected by the step back doping.

In particular, the donor and acceptor sheets 71 and 72, respectively, serve to create electrons, as shown by the minus signs (−) in the conduction band of the indium arsenide layer 25 and holes, as shown by the plus signs (+), in the valence band of the gallium antimonide layer 23. Additionally there is bending of all the bands to maintain charge neutrality and a constant chemical potential. The presence of free electrons in the affected end portions of the indium arsenide layer and of holes in the affected end portions of the gallium antimonide layer makes such end portions of such layers conducting.

However, in the preferred embodiment being described, the intermediate portions between such end portions of these layers remain essentially unaffected by any doping.

As a result, in the quiescent state the intermediate gate portions are maintained essentially insulating, and the off impedance of the device measured between electrodes 12 and 14 is maintained very high. To switch the device to the low impedance or "on" state, gating potentials need to be applied to the gate electrodes 16 and 18 to introduce electric fields that shift the relative positions of the band gaps of the quantum wells enough that the resulting overlap results in interband tunneling between the InAs and GaSb channels that effectively introduces enough charge carriers into the intermediate portions of the two channels that they become conducting. As a result, a low impedance is established between electrodes 12 and 14 and the device is "on". It is desirable that the overlap conditions be varied sufficiently to create a ratio of off-on conductance of at least several hundred and preferably at least a thousand.

For the embodiment being described, a gate voltage of between 2 and 3 volts is likely to be needed. If a lower threshold is desired, measures such as adjusting the internal electric field, can be taken to narrow the shift needed to provide the desired overlap, as is mentioned later.

Figure 4:
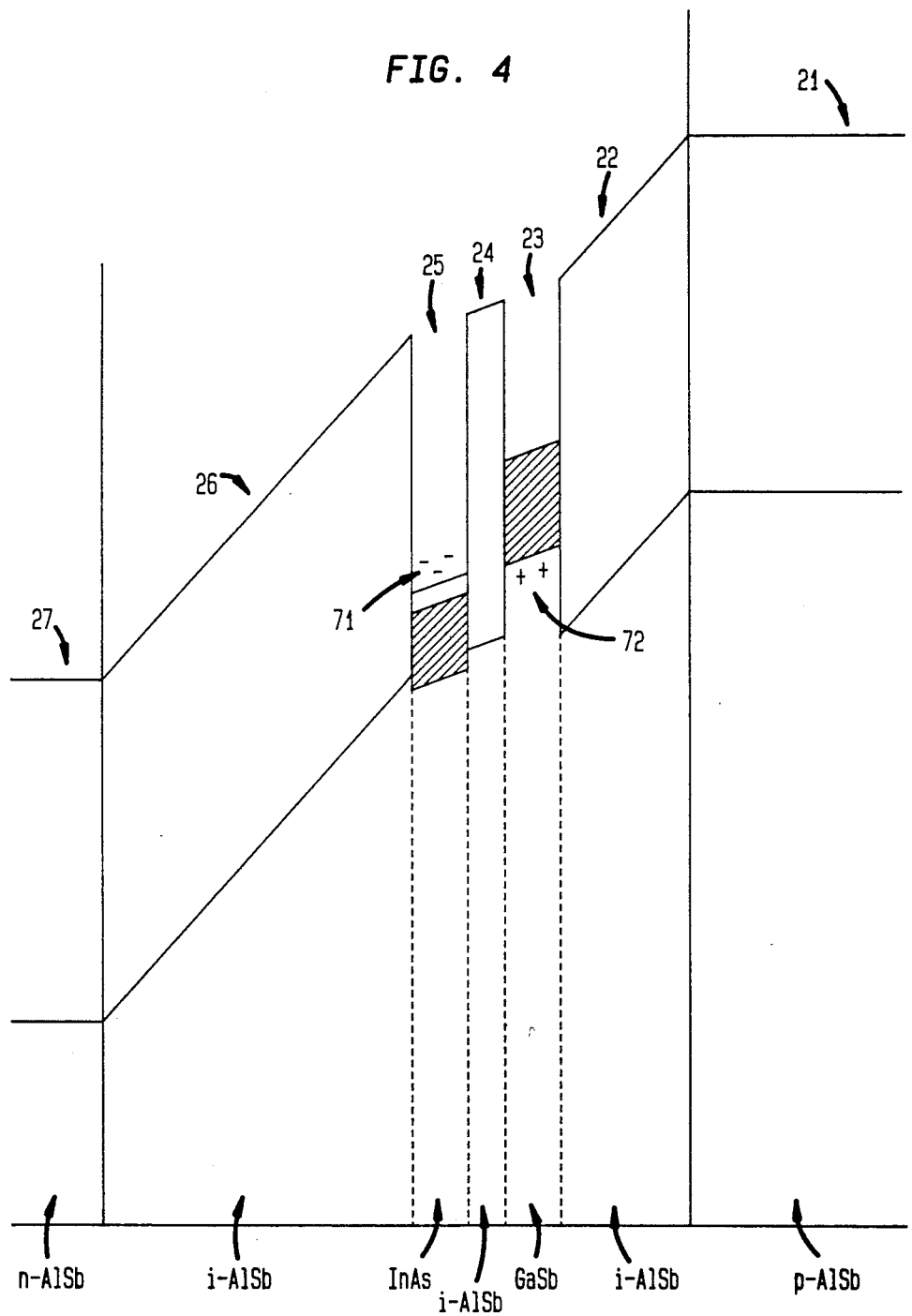
FIG. 4 is an energy diagram of the device shown in FIG. 1 after a gate voltage has been applied.

FIG. 4 is a band gap diagram of the gate portion of the wafer shown in FIG. 1 with a gating potential maintained between electrodes 16 and 18 of a polarity and magnitude adequate to shift the band gaps of the various layers, as depicted. In particular in this case, the bottom 71 of the conduction band in the indium arsenide layer 25 is made to overlap the top 72 of the valence band of the gallium antimonide layer 23 and electrons in the filled states of the valence band in the gallium antimonide are able to tunnel rapidly through the thin barrier layer 24 to empty states at the same energy level in the conduction band of the indium arsenide layer, equilibrating the chemical potentials of the holes and electrons. This creates free electrons in the gate portion of the indium arsenide layer and holes in the gate portion of the gallium antimonide layer. These act as charge carriers in such layers, so that the gate portions become conductive. The thicknesses of layers 22 and 26 advantageously are made sufficiently wide that inappreciable tunneling occurs from the contact layers 21 and 27 into the channels 23 and 25.

Now the full lengths of both the indium arsenide and gallium arsenide layers are conductive so that these layers can act as channels for the flow of current between electrodes 12 and 14 while a suitable bias voltage is maintained between electrodes 12 and 14. The device now is in the "on" or low impedance state.

It is calculated that with a separation of about 1000 angstroms between the n-type aluminum antimonide layer 27 and the p-type layer 21, and little voltage drop in the contact layers 21 and 27, a reverse voltage of between 2 and 3 volts applied between electrodes 16 and 18 will increase the conductivity of the channel carrier density by a factor of about 5000 at a temperature of about 77 degrees Kelvin. This factor decreases as the temperature rises and is considerably lower at room temperature. For these reasons, the illustrative embodiment being described in detail is intended to be cooled for operation at temperatures below room temperature, the cooler the higher the desired on/off ratio of conductance.

When the gating potential applied between electrodes 16 and 18 drops to zero, as at the end of a gating pulse, the band gaps of the various layers shift back to the quiescent state and the free electrons in the indium arsenide layer tunnel back through the thin barrier layer to return and refill the earlier-emptied states in the gallium antimonide, so that the quiescent high impedance state returns for the gate portions.

It is advantageous that the number of holes and free electrons created be substantially equal so that at the end of a pulse after the transfer occurs there are few free charge carriers available for conduction, and a high ratio of on-conductance to off-conductance is realized. This balance can be realized by appropriately adjusting the relative widths of layers 22 and 26. Since this balance also will be influenced by the properties realized for the various layers, the optimum dimensions are best found empirically, although typically layer 26 can be expected to be between two and three times thicker than layer 22 for the specific materials of the illustrative embodiment.

It is to be understood that the use of thin layers for the quantum wells is advantageous to keep short the tunneling time, a factor important for high switching speed. However, the use of such thin layers then results in the quantum confinement effects described. The quantum confinement effect itself is not a critical factor in the operation but rather is a consequence of using thin quantum wells.

Similarly, the use of step backing doping to introduce charge carriers into the quantum wells formed by the end portions of layers 23 and 25 is preferable to chemical doping of the actual layers themselves because chemical doping generally has a deleterious effect on the mobility of charge carriers in the material so doped. However, chemical doping of the layers 23 and 25 is an alternative if one is willing to tolerate the resulting reduced mobility.

In this device, the internal field created by the p-i-n structure of the aluminum antimonide host resulting from the presence of contact layers 21 and 23 enhances the offset between the gallium antimonide valence band and the indium arsenide conduction band, driving the three layers towards the semimetallic state. Advantageously, the internal field should be adjusted to be not strong enough to produce semimetallic behavior by itself but rather to assure that the semimetallic behavior sought can be realized at a desired threshold of applied gating potential.

In some instances, it is preferable to have a device that is in a low impedance in its quiescent state but can be switched to a high impedance by the application of an appropriate gating potential.

Figure 5:
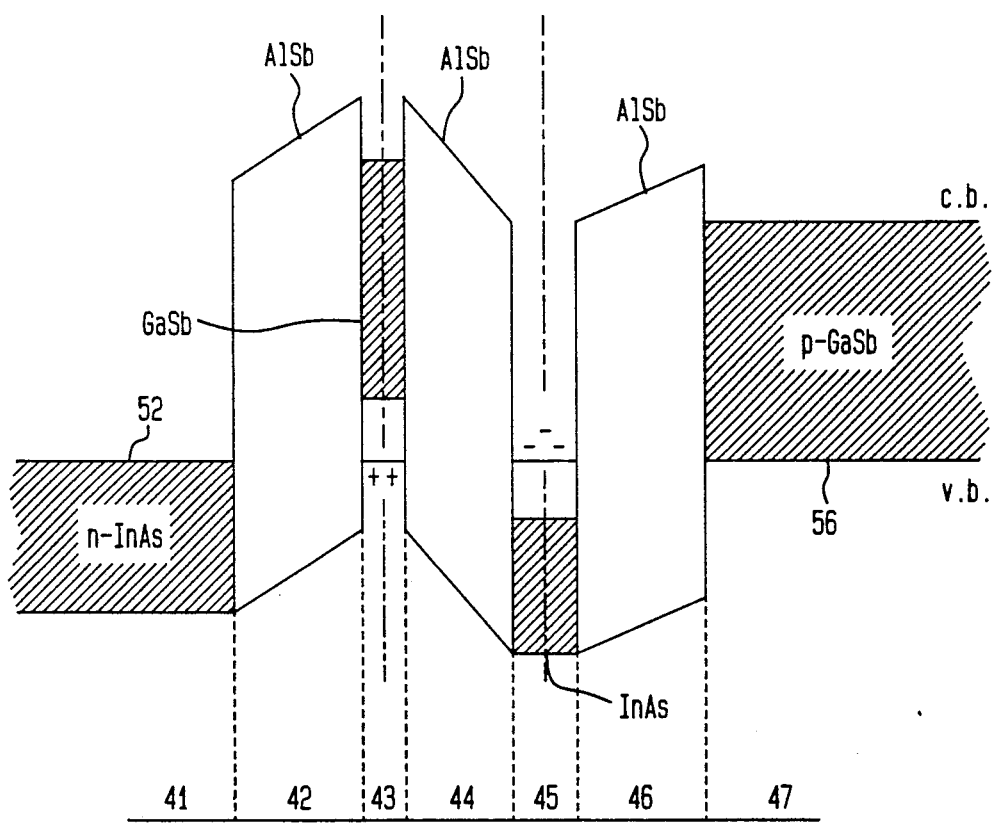
FIG. 5 is the energy diagram of another embodiment of the invention.

FIG. 5 is the energy diagram of a multilayer wafer that can be used in an embodiment of this kind. In essence, what is desired is a device in which the positions of the indium arsenide and gallium antimonide layers in the device shown in FIG. 1 have been interchanged. However, with just such an exchange, uncomfortably large doping levels in these layers are required to make the device conducting in the quiescent state since, in the inverted geometry, the built-in junction field created by the p-i-n profile, drives the dual channel towards the insulating state, the reverse of its role in the FIG. 1 device.

This problem is reduced by a further change in the wafer to a form that has a gate portion corresponding to the energy diagram depicted in FIG. 5. This wafer advantageously uses for materials in the n-type and p-type contact layers 41, 47 gallium antimonide and indium arsenide, respectively, because of the near coincidence of the bottom 52 of the indium arsenide conduction band and the top 56 of the gallium antimonide valence band.

In particular, as indicated by the horizontal axis of the energy diagram, the wafer includes a gate contact layer of n-doped indium arsenide 41, an intrinsic layer of aluminum antimonide 42, a layer of gallium antimonide 43, a layer of aluminum antimonide 44, a layer of indium arsenide 45, a layer of aluminum antimonide 46, and a gate contact layer of p-type gallium antimonide. Layer 43 and layer 45 provide the two quantum wells that form the pair of channels that are spaced apart by thin barrier layer 44 through which electrons will tunnel to convert the channel layers from semimetallic to semi-insulating when a proper bias is applied across the wafer to increase the effective band gap of the combined dual channels.

In the energy diagram depicted, which is of the quiescent state of the gate portion of the wafer, overlap between the bottom of the conduction band of the indium arsenide quantum well and the top of the valence band of the gallium antimonide quantum well, creates holes in the gallium antimonide channel and electrons in the indium arsenide quantum well, as represented by the plus and minus signs.

In this instance, application of a suitable voltage between the gate electrodes is used to shift the juxtaposition of the band gaps enough to eliminate these charge carriers by intraband tunneling.

As in the earlier structure, sheets of acceptor and donor ions advantageously are included in the aluminum antimonide layers close to the quantum wells to introduce holes in the gallium antimonide layer and electrons in the indium arsenide layer, respectively. Also the thinness and closeness of the quantum wells provides the previously mentioned quantum confinement effect that adds the cross hatched area to the effective gap between the valence and conduction bands.

The consequence of these various expedients, in the quiescent state, is to provide overlap between the top of the valence band of the gallium antimonide and the bottom of the conduction band of the indium arsenide, as seen, so that electrons can tunnel from the gallium antimonide to the indium arsenide. The effect of the application of a reverse gating voltage to the gate electrodes of the wafer is to shift the band gaps, raising the bottom of the conduction band of the indium arsenide relative to the top of the valence band of the gallium antimonide, thereby to eliminate the overlap and to have the free electrons in the conduction band of the indium arsenide tunnel back into the valence band of the gallium antimonide whereby the channels are converted from semiconducting to semiinsulating.

It can be appreciated that the specific embodiments described are merely illustrative of the general principles of the invention and that various other embodiments should be feasible without departing from the spirit and scope of the invention.

In particular, various other combinations of materials are possible, depending on the range of voltages and temperatures for which the devices are to be designed, the complexity in manufacturing that can be tolerated, and a better understanding of materials properties. As suggested above, it is desirable that the materials chosen are compatible in lattice spacings so that the multilayer structure can be essentially monocrystalline, particularly the portion that includes the quantum wells and barrier layer although because of their thinness, strained layers are tolerable, so that some lattice mismatched also is tolerable. It is also important that the channel materials form a misaligned type II superlattice in a wider band gap semiconductor host.

It is expected that the devices described can also serve with minor modification as optical modulators. In a single pass modulator, the light to be modulated would be passed through the wafer in a direction normal to the longitudinal direction of the quantum wells and variations in the conductance of the channels would be used to vary correspondingly the absorption of the light passing therethrough, in known fashion.

Alternatively, for multiple passes of the light through the quantum wells, the multilayer structure is made to serve as a longitudinal optical waveguide whose axis runs parallel to that of channels and the light to be modulated is passed longitudinally through the wafer in a manner to be trapped within the optical waveguide for multiple passes through the channels. Again, modulation of the conductance of the dual channel is made to vary the absorption of the light. As is to be expected, the wavelength of the light must be appropriately matched to the optical properties of the materials used for the quantum wells.

What is claimed is:

1. A semiconductive device comprising a multilayer wafer comprising at least first, third, and fifth layers of a first material having an energy band gap, a second layer intermediate between the first and third layers of a material having an energy band gap narrower than that of the first material, and a fourth layer intermediate between the third and fifth layers of a third material having an energy band gap narrower than that of the first material, the second and fourth layers dimensioned for forming two quantum wells and a second misaligned superlattice, the third layer being sufficiently thin that electrons can readily flow between the two quantum wells by interband tunneling when the bottom of the conduction band of the fourth layer overlaps the top of the valence band of the second layer, the second and third materials being different and such that the top of the valence band of one can selectively be made by the application of an electric field to one of overlapping and not overlapping the bottom of the conduction band of the other so that interband tunneling through the third layer can change the number of charge carriers in the second and fourth layers, a first pair of electrodes at opposite ends of the wafer for flowing current longitudinally through said wafer within the second and fourth layers, and a pair of electrodes on opposite sides of the wafer for applying an electric field normal to the multilayers for shifting controllably the energy band gaps of the materials forming the second and fourth layers between a condition of significant overlap and a condition of insignificant overlap.

2. A semiconductor device in accordance with claim 1 in which the materials of the second and fourth layers are such that in the absence of any voltage applied between the second pair of electrodes the bandgaps of the second and fourth layers essentially do not overlap and a high impedance state exists between the first pair of electrodes.

3. A semiconductive device in accordance with claim 2 in which the first and fifth layers include portions at each end that are adjacent to end regions of the second and fourth layers, respectively and these portions include a sheet of doping ions for introducing charge carriers in said end regions of the second and fourth layers.

4. A semiconductive device in accordance with claim 3 in which each of the second and fourth layers has intermediate portions free of doping ions between said end portions and the second pair of electrodes overlie said intermediate portions for controlling the bandgaps of said intermediate portions.

5. A semiconductive device in accordance with claim 1 in which the first, third and fifth layers are of aluminum antimonide, the second layer is of indium arsenide and the fourth layer is of gallium antimonide.

6. A semiconductive device in accordance with claim 5 in which the multilayer wafer further includes an n-type doped contact layer and a p-type doped contact layer at opposite surfaces.

7. A semiconductive device in accordance with claim 6 in which the layers form a p-i-n junction structure with at least the second, third, and fourth layers being in an i region of the structure.

8. A semiconductive device in accordance with claim 7 in which end portions of the first and fifth layers include a sheet of doping ions adjacent to the end regions of the second and fourth layers for introducing charge carriers in the end regions of the second and fourth layers.

9. A semiconductive device in accordance with claim 8 in which the first, third and fifth layer are essentially intrinsic aluminum antimonide, the second layer is of gallium antimonide, and the fourth layer is of indium arsenide, and the wafer further includes an n-type indium arsenide contact layer between the first layer and one of said first pair of electrodes and a p-type gallium antimonide contact layer between the fifth layer and the other of said first pair of electrodes.

* * * * *